United States Patent [19]

Tomita et al.

[11] Patent Number: 5,761,081

[45] Date of Patent: Jun. 2, 1998

[54] METHOD OF EVALUATING SIGNAL PROPAGATION DELAY IN LOGIC INTEGRATED CIRCUIT

[75] Inventors: Yasuhiro Tomita; Nobufusa Iwanishi; Ryuichi Yamaguchi; Hisakazu Edamatsu, all of Osaka, Japan

[73] Assignee: Matsushita Electric Industrial Co., Ltd., Osaka, Japan

[21] Appl. No.: 638,079

[22] Filed: Apr. 26, 1996

[30] Foreign Application Priority Data

Apr. 28, 1995 [JP] Japan ................... 7-105569

[51] Int. Cl.$^6$ ................... G06F 17/50
[52] U.S. Cl. ................... 364/490; 364/488
[58] Field of Search ................... 364/488, 489, 364/490, 491, 578

[56] References Cited

U.S. PATENT DOCUMENTS

| | | | |
|---|---|---|---|
| 5,239,481 | 8/1993 | Brooks et al. | 364/486 |
| 5,274,568 | 12/1993 | Blinne et al. | 364/489 |
| 5,359,535 | 10/1994 | Djaja et al. | 364/489 |
| 5,471,409 | 11/1995 | Tani | 364/578 |
| 5,548,526 | 8/1996 | Misheloff | 364/491 |
| 5,559,715 | 9/1996 | Misheloff | 364/488 |

FOREIGN PATENT DOCUMENTS

| | | |
|---|---|---|
| 2-264368 | 10/1990 | Japan. |
| 3-220676 | 9/1991 | Japan. |
| 4-135281 | 5/1992 | Japan. |
| 5-020386 | 1/1993 | Japan. |
| 5-129435 | 5/1993 | Japan. |

*Primary Examiner*—Kevin J. Teska
*Assistant Examiner*—Leigh Marie Garbowski
*Attorney, Agent, or Firm*—McDermott, Will & Emery

[57] ABSTRACT

Signal propagation delay in an inverter chain having a first inverter cell and a second inverter cell connected by an intercell wire, is evaluated. In order to guarantee that a first inverter cell delay is always evaluated to be positive (A) a logic threshold voltage for an increase in input pin voltage of the first inverter cell is set to a voltage below a switching threshold voltage of the first inverter cell, and (B) a logic threshold voltage for a decrease in input pin voltage of the first inverter cell is set to a voltage above the switching threshold voltage of the first inverter cell. Similarly, logic threshold voltages for an increase and a decrease in input pin voltage of the second inverter cell are determined. Additionally, in order to guarantee that an intercell wire delay is always evaluated to be positive, logic threshold voltages for an output pin voltage of the first inverter cell are made to agree with the logic threshold voltages for the input pin voltage of the second inverter cell.

3 Claims, 4 Drawing Sheets

METHOD OF EVALUATING SIGNAL PROPAGATION DELAY IN LOGIC INTEGRATED CIRCUIT

BACKGROUND OF THE INVENTION

This invention relates to a method of evaluating a signal propagation delay in a logic integrated circuit.

In the cell-based design of logic integrated circuits, the handling of delay information about individual cells is important for performing accurate timing simulation of the entirety of a logic integrated circuit.

An example of the structure of an inverter chain of a logic integrated circuit is shown in FIG. 1, which is formed by inverter cells connected by an intercell wire. 11 is a first inverter cell. 12 is a second inverter cell. Additionally, three intercell wires 13 are shown. The first inverter cell 11 has an input pin and an output pin. The first inverter cell 11 is built so that Vout1 (output pin voltage) begins to change when Vin1 (input pin voltage) reaches around Vthc1 (switching threshold voltage). The second inverter cell 12 has an input pin connected by an intercell wire 13 to the output pin of the first inverter cell 11, and an output pin. The second inverter cell 12 is built so that Vout2 (output pin voltage) begins to change when Vin2 (input pin voltage) reaches around Vthc2 (switching threshold voltage).

FIG. 2 shows a DC input/output characteristic curve of the first inverter cell 11. Vthc1 is defined as Vin1 or as Vout1 when Vin1 and Vout1 become equal on the curve. As can be seen from this, Vout1 begins to change when Vin1 reaches around Vthc1. Vthc2 is likewise defined. Usually, Vthc1 (the switching threshold voltage of the first inverter cell 11) and Vthc2 (the switching threshold voltage of the second inverter cell 12) differ from each other.

Conventionally, an average logic threshold voltage, Vthu, is used to evaluate a signal propagation delay in a logic integrated circuit. Here, Vthu, which is an average logic threshold voltage obtained by averaging Vthc1 and Vthc2, is employed. For rising input signals, (A) a time interval between when Vin1 increases up to Vthu and when Vout1 decreases down to Vthu is evaluated as Tpdc which is a delay of the first inverter cell 11, (B) a time interval between when Vout1 decreases down to Vthu and when Vin2 decreases down to Vthu is evaluated as Tpdw which is a delay of the intercell wire 13, and (C) the sum of Tpdc and Tpdw is evaluated as Tpd which is a propagation delay of a path connecting between the input pin of the first inverter cell 11 and the input pin of the second inverter cell 12. For falling input signals, (A') a time interval between when Vin1 decreases down to Vthu and when Vout1 increases up to Vthu is evaluated as Tpdc' which is a delay of the first inverter cell 11, (B') a time interval between when Vout1 increases up to Vthu and when Vin2 increases up to Vthu is evaluated as Tpdw' which is a delay of the intercell wire 13, and (C') the sum of Tpdc' and Tpdw' is evaluated as Tpd' which is a propagation delay of the path.

In another conventional technique, individual switching threshold voltages are used intact as logic threshold voltages, to evaluate signal propagation delays in a logic integrated circuit. This is explained by making use of the FIG. 1 inverter chain. For rising input signals, (A") a time interval between when Vin1 increases up to Vthc1 and when Vout1 decreases down to Vthc1 is evaluated as Tpdc, (B") a time interval between when Vout1 decreases down to Vthc1 and when Vin2 decreases down to Vthc2 is evaluated as Tpdw, and (C") the sum of Tpdc and Tpdw is evaluated as Tpd. For falling input signals, (A'") a time interval between when Vin1 decreases down to Vthc1 and when Vout1 increases up to Vthc1 is evaluated as Tpdc', (B'") a time interval between when Vout1 increases up to Vthc1 and when Vin2 increases up to Vthc2 is evaluated as Tpdw', and (C'") the sum of Tpdc' and Tpdw' is evaluated as Tpd'.

Both the above-described conventional techniques however suffer from some drawbacks. One major drawback is that in the cell-based design of high-density, low-power logic integrated circuits the result of the delay evaluation becomes negative when Vin1 slowly changes and when Vout1 rapidly changes. Such a drawback makes it difficult to perform an accurate timing simulation of the entirety of a logic integrated circuit. This negative delay problem is discussed by making reference to FIGS. 5 to 8.

FIG. 5 illustrates a negative delay problem with a rising input signal when Vthu is used. If Vthu is higher than Vthc1, then there is a possibility that Tpdc is evaluated to be negative. Tpdw is evaluated to be positive.

FIG. 6 illustrates a negative delay problem with a falling input signal when Vthu is used. If Vthu is lower than Vthc1, then there is a possibility that Tpdc' is evaluated to be negative. Tpdw' is evaluated to be positive.

FIG. 7 illustrates a negative delay problem with a rising input signal when Vthc1 and Vthc2 are used intact as logic threshold voltages. If Vthc2 is higher than Vthc1, then there is a possibility that Tpdw is evaluated to be negative. Tpdc is evaluated to be positive.

FIG. 8 illustrates a negative delay problem with a falling input signal when Vthc1 and Vthc2 are used intact as logic threshold voltages. If Vthc2 is lower than Vthc1, then there is a possibility that Tpdw' is evaluated to be negative. Tpdc' is evaluated to be positive.

SUMMARY OF THE INVENTION

Accordingly, it is an object of the present invention to provide an improved signal propagation delay evaluation method capable of ensuring positive delays for cells and intercell wires.

To achieve the object, the present invention uses a dual-threshold-voltage delay model in a method for evaluating a propagation delay of a signal in a path extending from an input pin of an inverter cell to an input pin of a next cell through an output pin of the inverter cell and through an intercell wire. More specifically, in order to ensure that a delay of the inverter cell is evaluated to be positive, a logic threshold voltage for an increase in input pin voltage of the inverter cell is set to a voltage below a switching threshold voltage of the inverter cell, while a logic threshold voltage for a decrease in input pin voltage of the inverter cell is set to a voltage above the switching threshold voltage of the inverter cell. Additionally, in order to ensure that a delay of the intercell wire is evaluated to be positive, a logic threshold voltage for an output pin voltage of the inverter cell and a logic threshold voltage for an input pin voltage of the next cell are made to agree.

In accordance with the present invention, negative delay problems can be solved, regardless of the conditions. In other words, neither the delay of the inverter cell nor the delay of the intercell wire is evaluated to be negative. This provides the advantage that accurate timing simulation of the entirety of a logic integrated circuit can be executed in the cell-based design of logic integrated circuits.

DETAILED DESCRIPTION OF THE INVENTION

Figure 1:
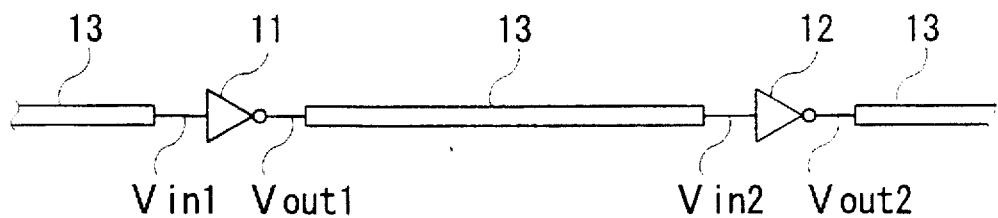
FIG. 1 is a circuit diagram showing a structure of an inverter chain in a logic integrated circuit relating to an application example of a delay evaluation method of the present invention.

Preferred delay evaluation methods according to this invention are described using, as an example, an inverter chain shown in FIG. 1.

Figure 3:
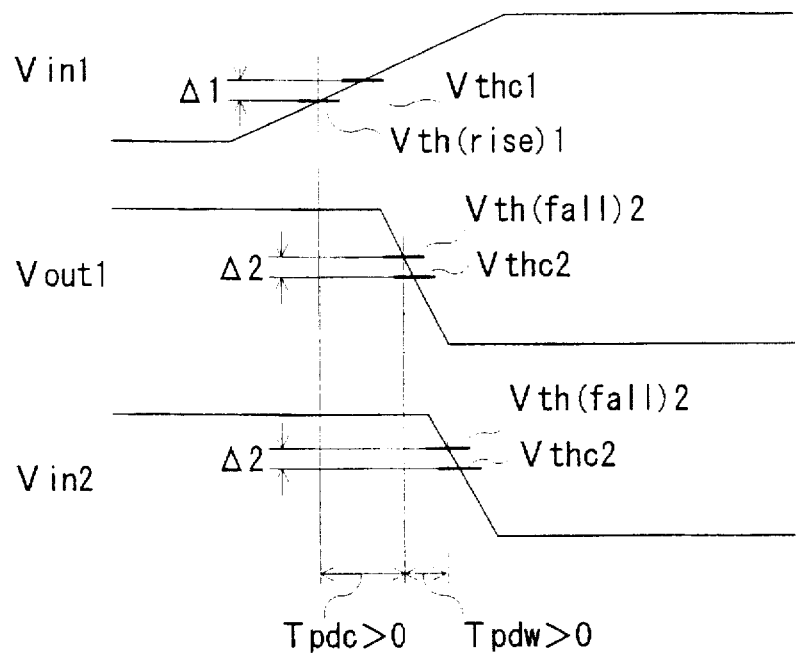
FIG. 3 is a timing diagram showing a delay evaluation method for a rising input signal of the present invention.

FIG. 3 shows a delay evaluation method for a rising input signal. Vth(rise)1, which is a first logic threshold voltage for the increase in Vin1, is set to a voltage below Vthc1. Vth(fall)2, which is a second logic threshold voltage for the decrease in Vin2, is set to a voltage above Vthc2. A logic threshold voltage for the decrease in Vout1 is set equal to Vth(fall)2. When a threshold voltage deviation of the first inverter cell 11 is represented by $\Delta 1$ (positive) and when a threshold voltage deviation of the second inverter cell 12 is represented by $\Delta 2$ (positive), the following equations hold.

$$Vth(rise)1 = Vthc1 - \Delta 1$$

$$Vth(fall)2 = Vthc2 + \Delta 2$$

A time interval between when Vin1 increases up to Vth(rise)1 and when Vout1 decreases down to Vth(fall)2 is evaluated as Tpdc. A time interval between when Vout1 decreases down to Vth(fall)2 and when Vin2 decreases down to Vth(fall)2 is evaluated as Tpdw. Further, the sum of Tpdc and Tpdw is evaluated as Tpd. The following equation holds.

$$Tpd = Tpdc + Tpdw$$

As can be seen from FIG. 3, when Vin1 reaches around Vthc1 after Vth(rise)1, Vout1 begins to decrease. This means that Tpdc is always evaluated to be positive. Additionally, Tpdw is always evaluated to be positive, since each of the logic threshold voltage for Vout1 and the logic threshold voltage for Vin2 is made to correspond to Vth(fall)2.

Figure 4:
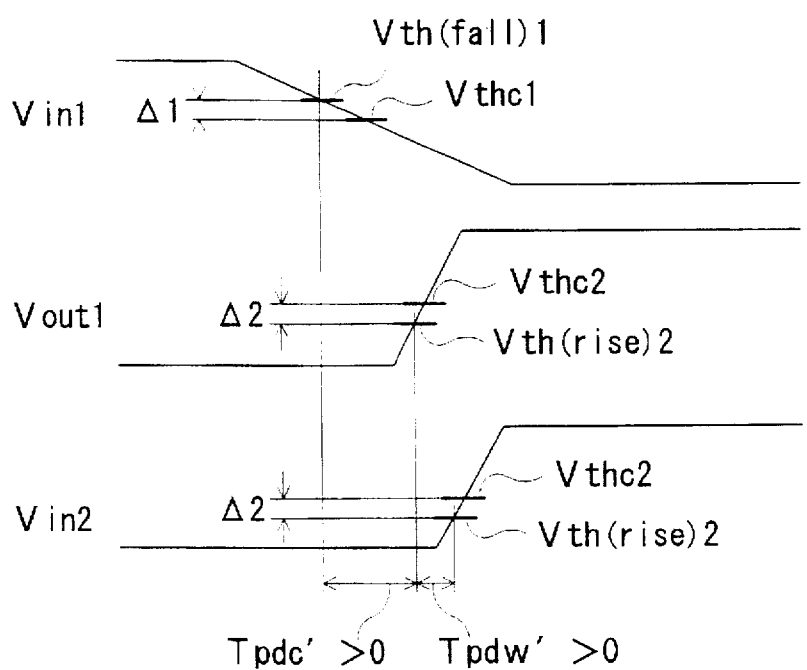
FIG. 4 is a timing diagram showing a delay evaluation method for a falling input signal of the present invention.
Figure 5:
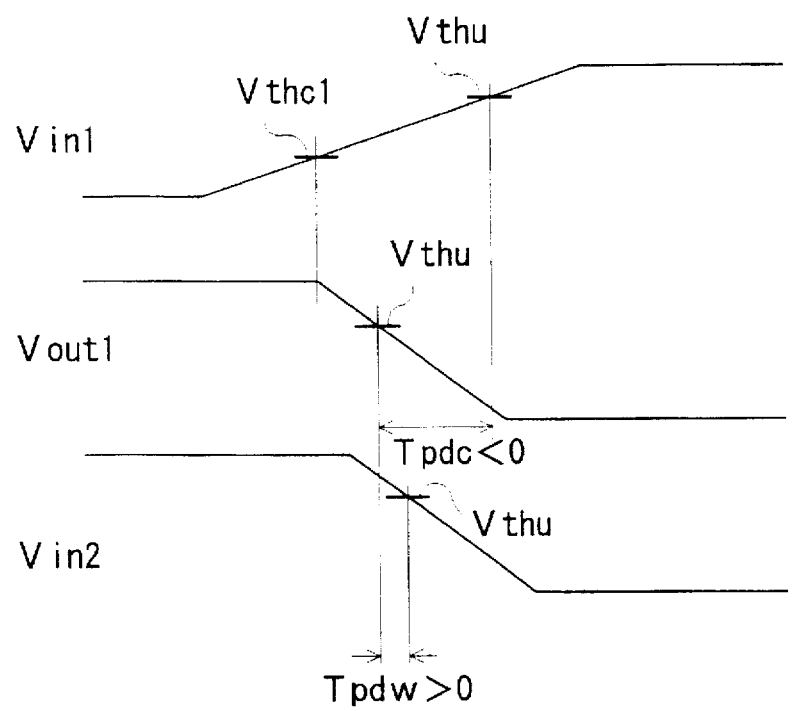
FIG. 5 is a timing diagram showing a conventional delay evaluation method for a rising input signal.
Figure 6:
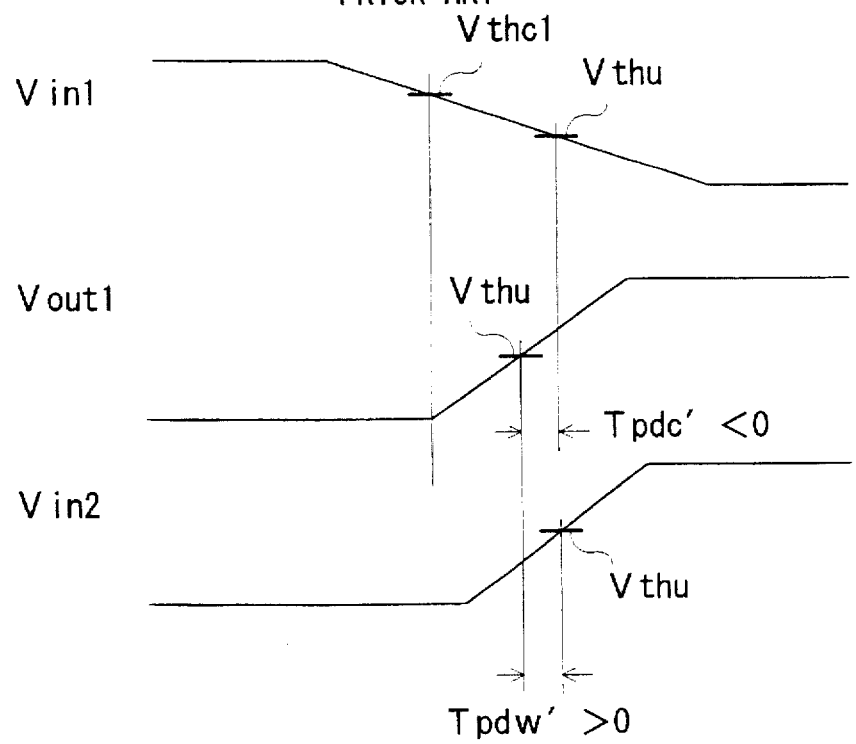
FIG. 6 is a timing diagram showing a conventional delay evaluation method for a falling input signal.
Figure 7:
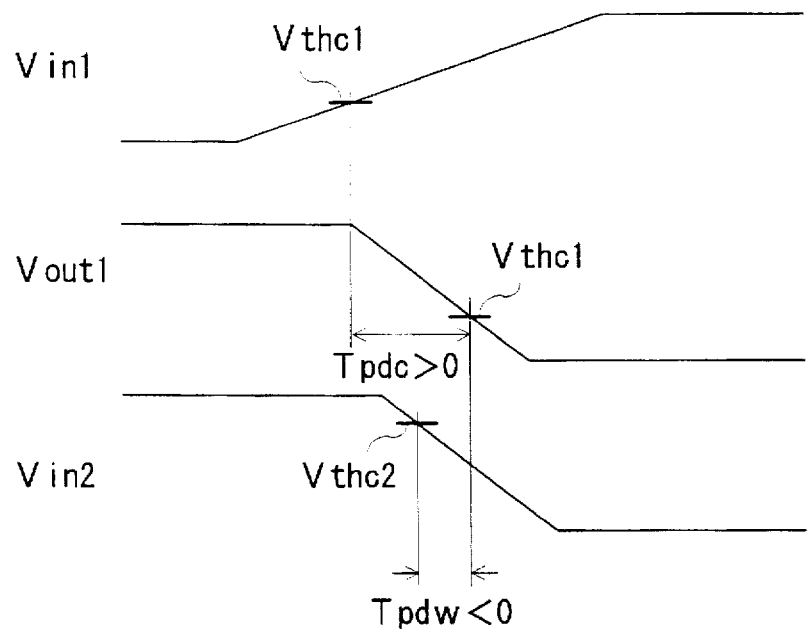
FIG. 7 is a timing diagram showing a conventional delay evaluation method for a rising input signal.
Figure 8:
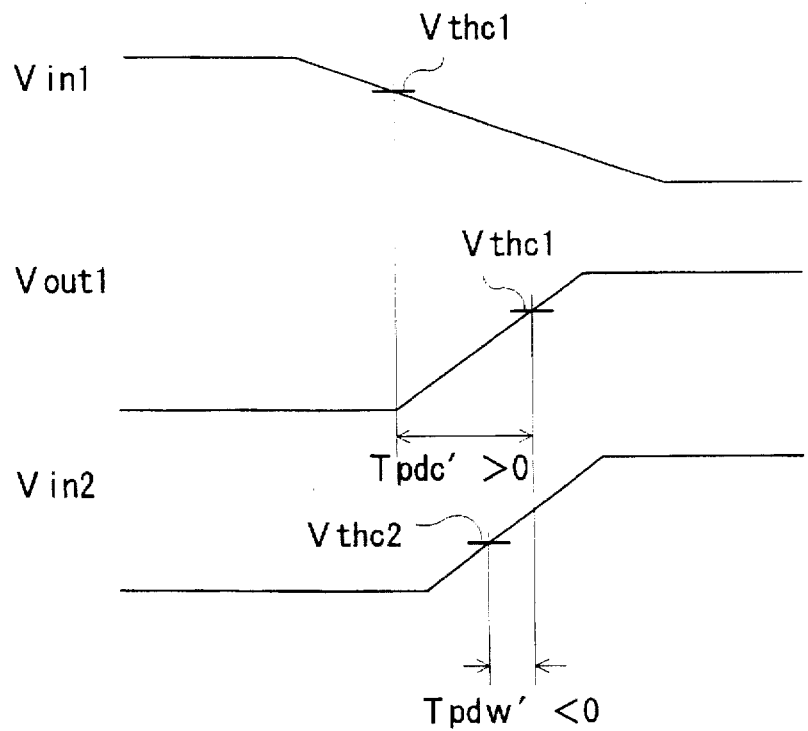
FIG. 8 is a timing diagram showing a conventional delay evaluation method for a falling input signal.

FIG. 4 shows a delay evaluation method for a falling input signal. Vth(fall)1, which is a third logic threshold voltage for the decrease in Vin1, is set to a voltage above Vthc1. Vth(rise)2, which is a fourth logic threshold voltage for the increase in Vin2, is set to a voltage below Vthc2. A logic threshold voltage for the increase in Vout1 is set equal to Vth(rise)2. Here, the following equations hold.

$$Vth(fall)1 = Vthc1 + \Delta 1$$

$$Vth(rise)2 = Vthc2 - \Delta 2$$

A time interval between when Vin1 decreases down to Vth(fall)1 and when Vout1 increases up to Vth(rise)2 is evaluated as Tpdc'. A time interval between when Vout1 increases up to Vth(rise)2 and when Vin2 increases up to Vth(rise)2 is evaluated as Tpdw'. Further, the sum of Tpdc' and Tpdw' is evaluated as Tpd'. The following equation therefore holds.

$$Tpd' = Tpdc' + Tpdw'$$

As can be seen from FIG. 4, when Vin1 reaches around Vthc1 after Vth(fall)1, Vout1 begins to increase. Because of this, Tpdc' is always evaluated to be positive. Additionally, Tpdw' is always evaluated to be positive, since each of the logic threshold voltage for Vout1 and the logic threshold voltage for Vin2 is made to correspond to Vth(rise)2.

Negative delay problems with the prior art techniques can be solved by employing the above-described double-threshold-voltage delay model of the present invention. It therefore becomes possible to perform an accurate timing simulation of the entirety of a logic integrated circuit. Additionally, it also becomes possible to optimize timing margins of individual cells in the cell-based design of high-density, low-power logic integrated circuits.

Figure 2:
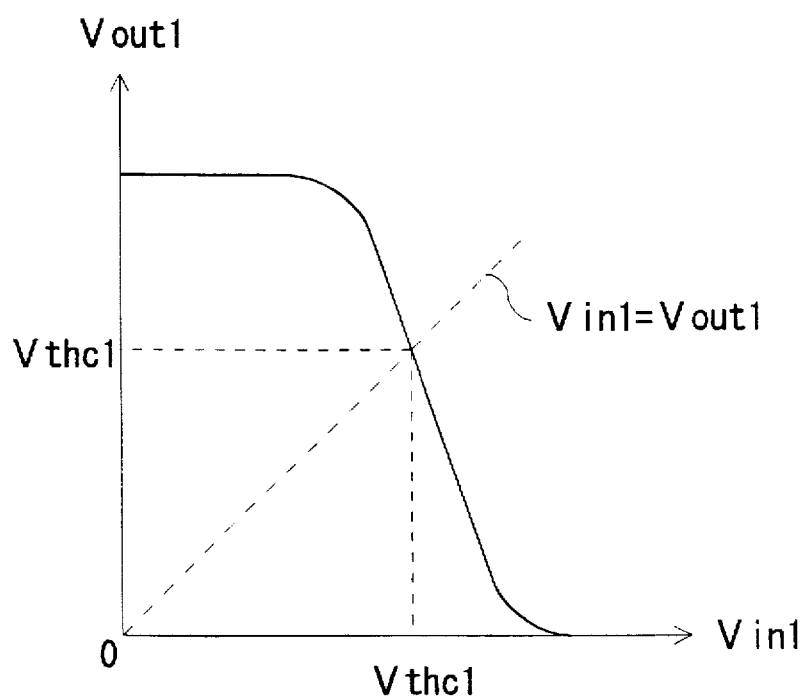
FIG. 2 is a diagram describing a switching threshold voltage of a first inverter cell of FIG. 1.

The threshold voltage deviation of the first inverter cell 11, $\Delta 1$, is set to about half of a Vin1 range corresponding to a portion of the FIG. 2 characteristic curve with a large slope, i.e., with a large absolute value of dVout1/dVin1. For the case of usual sub-micron CMOS cells, it is appropriate that $\Delta 1$ is set to from 1% to 10% of Vdd (supply voltage). Such is likewise applicable to the threshold voltage deviation of the second inverter cell 12, $\Delta 2$.

It may be arranged such that Vth(rise)1 and Vth(rise)2 agree and Vth(fall)1 and Vth(fall)2 agree. Such arrangement is applicable to any other cells. In other words, Vth(rise) and Vth(fall), which are common logic threshold voltages to the increase in input signal voltage and to the decrease in input signal voltage, respectively, to all cells, may be used. It is designed so that Vth(rise) is set to the minimum of Vthcj−$\Delta$j (shifted logic threshold voltages of the individual cells for rising input signals) and Vth(fall) is set to the maximum of Vthcj +$\Delta$j (shifted logic threshold voltages of the individual cells for falling input signals). This reduces the amount of data about cell logic threshold voltages.

The double-threshold-voltage delay model may easily find applications in non-inverting buffer cells and in multi-input and multi-output cells. In an actual cell-based design of logic integrated circuits, the delay model of this invention is used to generate from a standard cell circuit library a cell delay time formula library. A delay time formula of a typical cell with a plurality of input pins and a plurality of output pins is given as a function of an input pin identification number, an output pin identification number, an input signal transition direction, logic threshold voltages, an input signal slope, and an output load. Accurate timing simulation of an entire logic integrated circuit can be executed on the basis of design netlists, intercell wire RC parameter data, and the cell delay formula library.

The invention claimed is:

1. In a logic integrated circuit comprising (A) a first cell formed by an inverter with a first input pin and a first output pin wherein said first cell is built so that a voltage of said first output pin begins to change when a voltage of said first input pin reaches around a first switching threshold voltage and (B) a second cell with a second input pin connected by an intercell wire to said first output pin and a second output pin wherein said second cell is built so that a voltage of said second output pin begins to change when a voltage of said second input pin reaches around a second switching threshold voltage, a method for evaluating propagation delays of signals in a path connecting between said first input pin and said second input pin, said method comprising the steps of:

setting a first logic threshold voltage for an increase in the voltage of said first input pin, to a voltage below said first switching threshold voltage;

setting a second logic threshold voltage for a decrease in the voltage of said first output pin, to a voltage above said second switching threshold voltage;

evaluating a time interval between when the voltage of said first input pin increases up to said first logic threshold voltage and when the voltage of said first output pin decreases down to said second logic threshold voltage, as a first delay of said first cell;

evaluating a time interval between when the voltage of said first output pin decreases down to said second logic threshold voltage and when the voltage of said second input pin decreases down to said second logic threshold voltage, as a first delay of said intercell wire; and evaluating a sum of said first delay of said first cell and said first delay of said intercell wire, as a first propagation delay of a signal in said path.

2. A method according to claim 1 further comprising the steps of:

setting a third logic threshold voltage for a decrease in the voltage of said first input pin, to a voltage above said first switching threshold voltage;

setting a fourth logic threshold voltage for an increase in the voltage of said first output pin, to a voltage below said second switching threshold voltage;

evaluating a time interval between when the voltage of said first input pin decreases down to said third logic threshold voltage and when the voltage of said first output pin increases up to said fourth logic threshold voltage, as a second delay of said first cell;

evaluating a time interval between when the voltage of said first output pin increases up to said fourth logic threshold voltage and when the voltage of said second input pin increases up to said fourth logic threshold voltage, as a second delay of said intercell wire; and evaluating a sum of said second delay of said first cell and said second delay of said intercell wire, as a second propagation delay of a signal in said path.

3. A method according to claim 2 further comprising the steps of:

making said third logic threshold voltage correspond to said second logic threshold voltage; and making said fourth logic threshold voltage correspond to said first logic threshold voltage.

* * * * *